United States Patent
Deeney et al.

(10) Patent No.: US 6,882,536 B2
(45) Date of Patent: Apr. 19, 2005

(54) WRAP-AROUND COOLING ARRANGEMENT FOR PRINTED CIRCUIT BOARD

(75) Inventors: Jeffrey L. Deeney, Fort Collins, CO (US); Joseph D. Dutson, Loveland, CO (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 266 days.

(21) Appl. No.: 10/131,476

(22) Filed: Apr. 25, 2002

(65) Prior Publication Data

US 2003/0202328 A1 Oct. 30, 2003

(51) Int. Cl.[7] .............................................. H05K 7/20
(52) U.S. Cl. ........................ 361/719; 165/185; 361/704
(58) Field of Search ................................ 361/704, 705, 361/707–712, 717–719; 165/80.3, 185; 174/16.3, 252; 257/706, 707, 712, 713, 718, 719, 723, 724, 726, 727

(56) References Cited

U.S. PATENT DOCUMENTS

| 5,184,283 A | | 2/1993 | Hamel | |
| 5,237,485 A | * | 8/1993 | Cognetti de Martiis et al. | 361/712 |
| 5,272,599 A | | 12/1993 | Koenen | |
| 5,513,073 A | * | 4/1996 | Block et al. | 361/719 |
| 6,025,992 A | * | 2/2000 | Dodge et al. | 361/704 |
| 6,025,993 A | * | 2/2000 | Wakabayashi et al. | 361/705 |
| 6,259,602 B1 | * | 7/2001 | Malhammar | 361/704 |
| 6,349,035 B1 | * | 2/2002 | Koenen | 361/719 |

FOREIGN PATENT DOCUMENTS

GB      1194172      6/1970

* cited by examiner

Primary Examiner—Gerald Tolin

(57) ABSTRACT

A wrap-around cooling arrangement for a printed circuit board is disclosed. Such an arrangement comprises: a printed circuit board ("PCB") having a first side and a second side opposite to said first side; a heat sink arranged on said first side of said PCB; a first to-be-cooled component coupled to said second side of said PCB; and a thermal jumper to thermally couple said first component on said second side to said heat sink on said first side, said jumper being configured to extend physically around a side edge of said PCB.

28 Claims, 4 Drawing Sheets

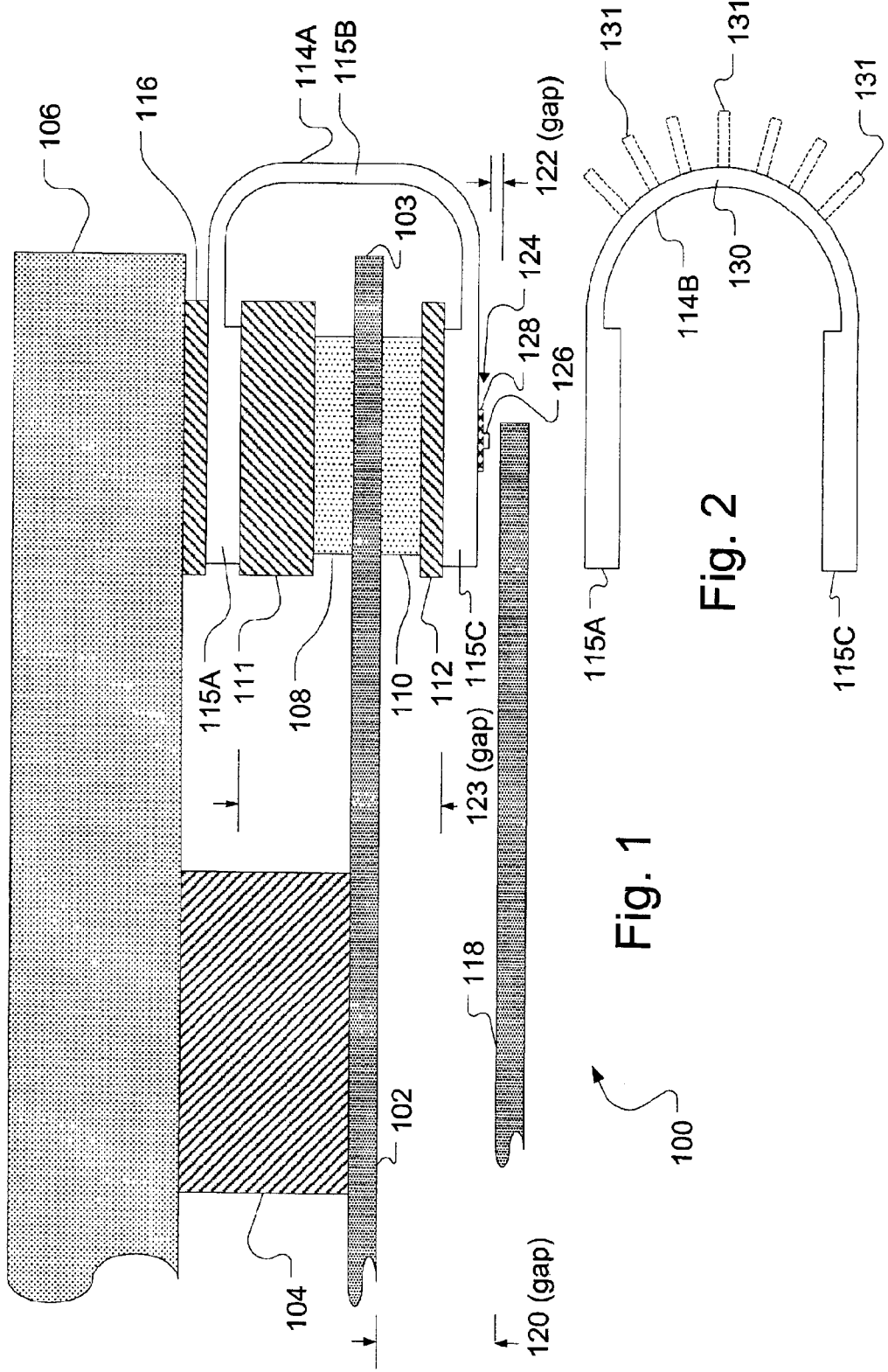

WRAP-AROUND COOLING ARRANGEMENT FOR PRINTED CIRCUIT BOARD

FIELD OF THE INVENTION

The invention is generally directed to the field of arrangements for cooling components attached to a printed circuit board, and more particularly to such arrangements that wrap around an edge of the printed circuit board.

BACKGROUND OF THE INVENTION

It is known to cool components on a printed circuit board (PCB) using a heat sink. A heat sink is a device for transferring heat from the electronic components into the ambient environment. The heat sink can be a finned metal (typically aluminum) element with or without forced airflow across it. A heat sink can also be a liquid cooled jacket or thermoelectric device. Heat pipes can also be used to transfer the heat from the heat sink. Alternatively, the heat sink could be the chassis of the computer.

Typically, a heat sink is located on the same side of the PCB as the components that it cools. And it is common for the heat sink to sit on the components that are to be cooled in what can be described as a stacked arrangement.

In a circumstance in which there is relatively little clearance above the surfaces of the PCB, this stacked arrangement can be unsatisfactory.

SUMMARY OF THE INVENTION

The invention, in part, provides an arrangement for cooling components on a printed circuit board, the arrangement comprising: a printed circuit board ("PCB") having a first side and a second side opposite to said first side; a heat sink arrangement on said first side of said PCB; a first to-be-cooled component attached to said second side of said PCB; and a thermal jumper to thermally couple said first component on said second side to said heat sink on said first side, said jumper being configured to extend physically around a side edge of said PCB.

The invention, also in part, provides an arrangement for cooling components on a printed circuit board, the arrangement comprising: a printed circuit board ("PCB") having at least first and second to-be-cooled components attached to said PCB, said first component being located on a first side of said PCB and said second component being located on a second side of said PCB, said second side being opposite to said first side; a heat sink arranged on said first side of said PCB, said heat sink being thermally coupled to said first component; and a thermal jumper to thermally couple said second component on said second side to said heat sink on said first side, said jumper being configured to extend physically around a side edge of said PCB.

Additional features and advantages of the invention will be more fully apparent from the following detailed description of the preferred embodiments, the appended claims and the accompanying drawings.

BRIEF DESCRIPTION OF THE DRAWINGS

FIG. 1 is a cross-section of a first embodiment of a wrap-around cooling arrangement for a printed circuit board according to the invention.

FIG. 2 is a cross-section of an alternative configuration of a thermal jumper according to the first embodiment of the invention.

DETAILED DESCRIPTION OF THE PREFERRED EMBODIMENTS

Figure 3:
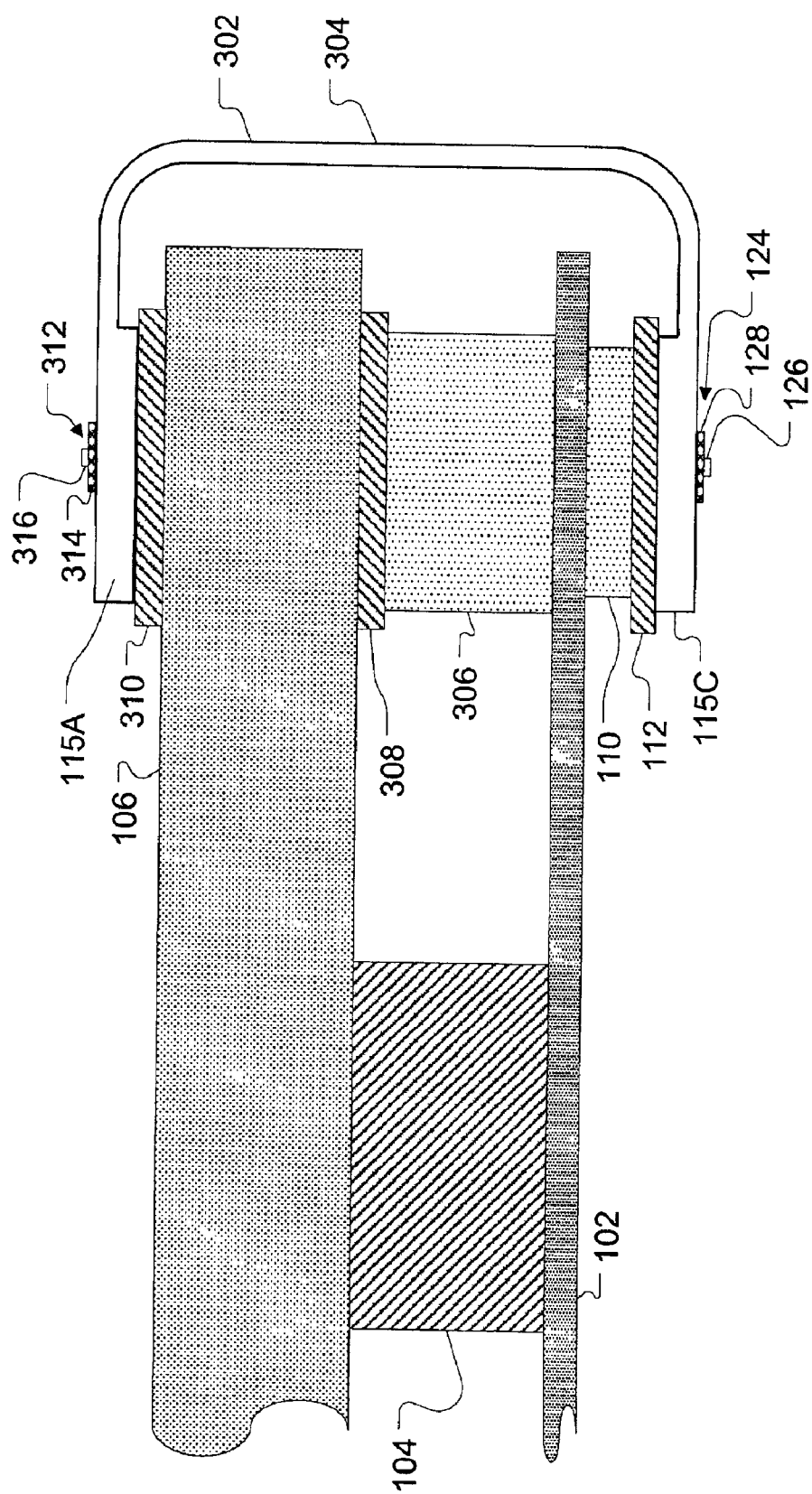
FIG. 3 is a cross-sectional view of a second embodiment of a wraparound cooling arrangement for a printed circuit board according to the invention.

FIG. 1 is a cross-section of a first embodiment of a wrap-around cooling arrangement for a printed circuit board according to the invention. In FIG. 1, a printed circuit board ("PCB") 102 is provided with a component 104 that is to be cooled. The component 104 can be located inward of a side edge 103 of the PCB 102.

The arrangement 100 of FIG. 1 is also provided with a heat sink 106. As in the section above entitled "Background Of The Invention," the heat sink 106 can be a finned metal (e.g., aluminum) element with or without forced airflow across it, a liquid cooled jacket and/or thermoelectric device. Heat pipes can also be used to transfer the heat from the heat sink. Alternatively, the heat sink could be (in part or in whole) the chassis of the computer in which the PCB 102 is located.

The heat sink 106 is depicted as abutting the component 104. The component 104 may or may not be provided with a thermal coupling structure or compound (e.g., a thermally-conductive gap pad) between it and the heat sink 106. Examples of the component 104 are a central processing unit ("CPU") type of integrated circuit device, an application specific integrated circuit ("ASIC") or a digital signal processor ("DSP"), etc.

Also attached to the PCB 102 are to-be-cooled components 108 and 110, e.g., integrated circuit memory devices. Components 108 and 110 will typically be located closer to an edge of the PCB 102 than the component 104. Inserted between the component 108 and the heat sink 106 are a thermally-conductive gap pad 111, a planar portion 115A of a thermal jumper 114A, and a thermally-conductive gap pad 116. Inserted between the component 110 and the heat sink 106 are a thermally-conductive gap pad 112 and a planar portion 115C of the thermal jumper 114A. Each of the gap pads 112, 111 and 116 is optional but preferred.

An example of the thermally-conductive gap pad material from which the gap pads 111, 112 and 116 can be made is the GAP PAD 1500 brand of thermally-conductive pad made available by THE BERGQUIST COMPANY.

In addition to the planar portion 115A and 115C, the thermal jumper 114A includes a portion 115B that wraps around the side edge 103 of the PCB 102. In cross-section, the wrap-around portion 115B has a substantially square-U shape. FIG. 2 depicts an alternative configuration to that of thermal jumper 114A, namely thermal jumper 114B. Jumper 114B has the same planar portion 115A and 115C. But jumper 114B differs by the configuration of the wrap-around portion 130, which in cross-section is substantially semi-circular. It should be noted that the configuration in cross-section of the wrap-around portion of the jumper is not critical. The wraparound portion should clear the end 103 of the PCB 102.

To ensure good thermal contact between the surfaces in the stack including planar portion 115C, gap pad 112 and to-be-cooled device 110, as well as in the stack including to-be-cooled device 108, gap pad 111, planar portion 115A and gap pad 116, an optional (but preferred) compression arrangement 124 is provided. The arrangement 124 can include a threaded bolt 126 that has a corresponding threaded hole in the heat sink 106 such that the bolt 126 passes through the planar surface 115C, the gap pad 112, the to-be-cooled device 110, the PCB 102, the to-be-cooled device 108, the gap pad 111, the planar portion 115A and the gap pad 116. Optionally, a washer 128 can be provided between the head of the bolt 126 and the planar portion 115C. Alternatively, instead of a threaded hole in the heat sink 106, the bolt 126 can be of sufficient length to pass through the heat sink 106 where it can couple to a nut (not depicted) and optionally a lock washer (not depicted) and/or flat washer (not depicted).

In the circumstance where the to-be-cooled devices 108 and 110 are the same type of device, then probably it will be desired for these devices to run at substantially the same temperature. If so, then both should be provided with an equivalent thermal resistance.

Thermal resistance is, in part, a function of a number of factors including the distance between the device that is to be cooled and the heat sink, cross-sectional area of the thermal connector and thermal conductivity. Inspection of FIG. 1 reveals that the thermal path to the heat sink 106 from the device 108 includes the gap pad 116 and the planar portion 115A. In contrast, the thermal path between the heat sink 106 and the device 110 includes the planar portion 115C, the wraparound portion 115B, planar portion 115A and the gap pad 116. By having fewer segments, the thermal path to dissipate heat from the device 108 could be shorter, i.e., could be more efficient, than for the device 110. If devices 108 and 110 are to face equivalent thermal resistance, then a compensation factor must be added to the thermal path for the device 108. This can be accomplished by appropriate selection of the thicknesses and thermal conductivities of the gap pads, e.g., by making the gap pads 111 and 112 be of different thickness (assuming the same thermal conductivity).

According to the first embodiment of the invention depicted in FIG. 1 (which assumes devices 108 and 110 are the same device), the gap pad 111 is much thicker than the gap pad 112. The greater thickness of the gap 111 decreases the thermal efficiency of the thermally conductive path between the device 108 and the heat sink 106. In one example embodiment, the gap pad 112 has a thickness of 0.03 inch while the thickness of the gap pad 111 is 0.08 inch.

An advantage to the wrap-around thermal jumper according to the invention is that it permits devices on a second side of a PCB 102 to effectively be cooled by a heat sink on a first side of a PCB 102. This can be important in situations where there is very little clearance between the PCB 102 and an adjacent structure. An example of such a circumstance is where the PCB 102 is a daughter card to a mother card, denoted as 118 in FIG. 1. There, the gap 120 between the PCB 102 and the PCB 118 is relatively small. Use of the wrap-around thermal jumper permits the device 110 to be cooled via the heat sink 106 and yet preserve a gap 122 between the components of the PCB 102 and the PCB 118. An example of the size of gap 122 is one millimeter.

The wrap-around sections 115B and 130 have been depicted as significantly thinner in cross section than the planar portions 115A and 115C. Example thicknesses for the thermal jumper 114A are 0.04 inch for the planar portions 115A and 115C versus 0.01 inch thickness for the wrap-around portion 115B.

The significantly thinner wrap-around sections 115B and 130 permit the thermal jumper 114A/114B to exhibit flexibility in the distance 123 between the planar portions 115A and 115C. This confers an advantage during manufacture.

It has been found that the surfaces of the gap pads 111 and 112 have a significant coefficient of friction. It is difficult to slide the planar portions 115A and 115C across the surfaces of the gap pads 111 and 112, respectively, due to the pads' coefficient of friction. If thermal jumper 114A/114B were extremely rigid, then this would be the only way to bring the planar portions 115A and 115C into contact with the gap pads 111 and 112.

But because the thinner cross-section of the wrap-around portions 115B/130 permit flexibility in the distance 123 between the planar potions 115A and 115C, the planar portions 115A and 115C can be spread apart (increasing gap 123) to allow positioning over the gap pad 111 and 112 by holding the planar portions 115A and 115C under tension. When the tension is removed, the distance 123 is restored to its nominal value (either by the inherent resilience of the jumper 114A or by application of a compressive force), bringing planar portions 115A and 115C into contact with the surfaces of the gap pads 111 and 112. It is to be noted that it is not necessary for the wrap-around portions 115B and 130 to be thinner in cross section than the planar portions 115A and 115C, but it is preferred because of the flexibility in the dimension between the planar surfaces 115A and 115C that it confers.

Yet another alternative configuration for the wrap-around portion would be for it to be finned so as to also function as a heat sink. This alternative is less preferred because of the cost associated with finning the wrap-around portion. If manufacturing costs decrease, this would be a more preferable alternative. Using the jumper 114 of FIG. 2 as an example, optional cooling fins 131 have been depicted in phantom lines. The fins 131 project from the convex side of the wraparound portion 130. But the fins 131 instead, or additionally, could be arranged to project from the concave surface of the wrap-around portion 130. The fins 131 should not interfere with the flexing of the jumper 114B during the installation of the jumper. The use of fins 131 may be constrained by space and airflow considerations. The fins 131 can be placed on all other embodiments of the jumper.

The thermal jumper 114A/114B is preferably made of copper because copper is relatively easy to manufacture, is a good thermal conductor and is relatively cheap. Any conductor could suffice as an alternative material. Carbon fiber would be an especially good alternative but for its relatively much greater expense.

FIG. 3 is a cross-sectional view of a second embodiment of a wraparound cooling arrangement for a printed circuit board according to the invention. In FIG. 3, a wrap-around thermal jumper has been adapted so that the planar portion 115A attaches to the upper surface of the heat sink 106. A thermally-conductive gap pad 310 is interposed between the heat sink 106 and the planar portion 115A. An optional (but preferred) compression arrangement 312 is provided that is similar to the compression arrangement 124. As such, a threaded bolt 316 and an optional washer 314 are depicted. Alternatively, item 314 can be considered a nut and the bolt 126 can be of sufficient length to pass through the heat sink 106 where it can be coupled to the nut 314.

Compared to the wrap-around portion 115B of jumper 114A in FIG. 1, the wrap-around portion 304 is elongated. Also depicted in FIG. 3 are a component 306 and its corresponding gap pad 308 Component 306 and pad 308 represent an optional use of the space between the cantilevered portion of the heat sink 106 (that extends beyond the device 104) and the PCB 102.

Figure 4:
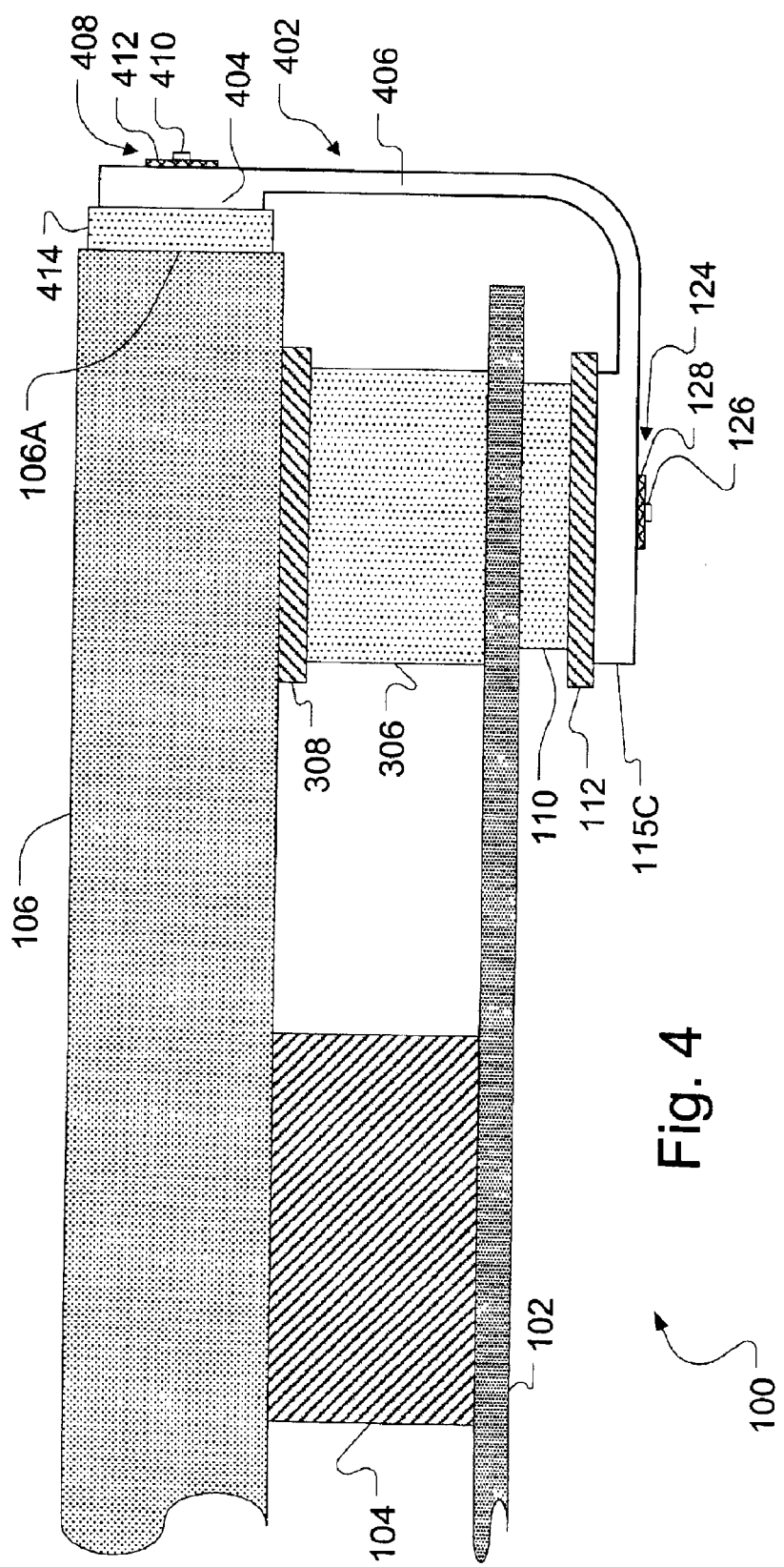
FIG. 4 is a cross-sectional view of a third embodiment of a wrap-around cooling arrangement for a printed circuit board according to the invention.

FIG. 4 is a cross-sectional view of a third embodiment of a wrap-around cooling arrangement for a printed circuit board according to the invention. In FIG. 4, a wrap-around thermal jumper 402 has been adapted so that the planar portion 404 attaches to the side end 106A of the heat sink 106. A thermally-conductive gap pad 414 is interposed between the heat sink 106 and the planar portion 404. An optional (but preferred) compression arrangement 408 is provided that is similar to the compression arrangement 124. As such, a threaded bolt 410 and an optional washer 412 are depicted. Compared to the wrap-around portion 115B of jumper 114A in FIG. 1, the wrap-around portion 406 is rounded only at one end.

In FIG. 4, the side end 106A of the heat sink 106 has been arranged to extend beyond the side end 103 of the PCB. This is not strictly necessary, but simplifies the configuration of the wrap-around portion 406, i.e., further articulation in the wrap-around portion 406 can be avoided.

Figure 5:
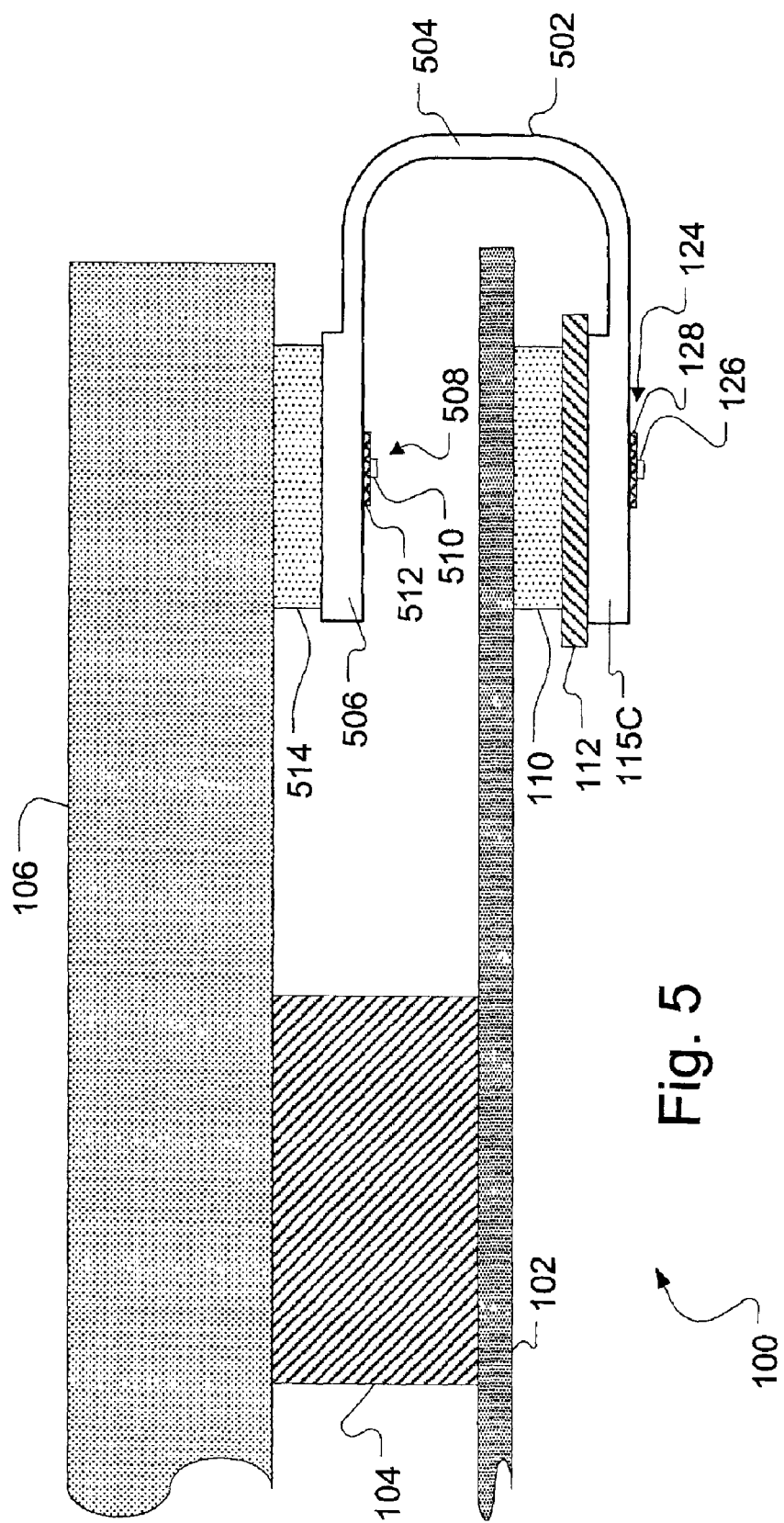
FIG. 5 is a cross-sectional view of a fourth embodiment of a wraparound cooling arrangement for a printed circuit board according to the invention.

FIG. 5 is a cross-sectional view of a fourth embodiment of a wraparound cooling arrangement for a printed circuit board according to the invention. In FIG. 5, a wrap-around thermal jumper 502 has been adapted so that the planar portion 506 attaches to the lower surface of the heat sink 106. A thermally-conductive gap pad 514 is interposed between the heat sink 106 and the planar portion 506. An optional (but preferred) compression arrangement 508 is provided that is similar to the compression arrangement 124. As such, a threaded bolt 510 and an optional washer 512 are depicted. In this embodiment, the threaded bolt either screws into the heat sink 106 or is of sufficient length to pass through the heat sink 106 where it can couple to a nut (not depicted) and optionally a lock washer (not depicted) and/or flat washer (not depicted).

It is to be observed that the planar portion 506 has the opposite connection orientation (notch oriented outwardly) relative to the wrap-around portion 504 as does the planar portion 115C (notch oriented inwardly). In contrast, the planar portion 115A of FIG. 1 can be described as having the same connection orientation (notch oriented inwardly) relative to the wrap-around portion 115B as does the planar portion 115C.

The invention may be embodied in other forms without departing from its spirit and essential characteristics. The described embodiments are to be considered only non-limiting examples of the invention. The scope of the invention is to be measured by the appended claims. All changes which come within the meaning and equivalency of the claims are to be embraced within their scope.

What is claimed:

1. An arrangement for cooling components on a printed circuit board, the arrangement comprising:
    a printed circuit board ("PCB") having a first side and a second side opposite to said first side;
    a heat sink arranged on said first side of said PCB;
    a first to-be-cooled component arranged on said second side of said PCB; and
    one or more thermal jumpers thermally couple said first component on said second side to said heat sink on said first side, a majority of heat produced by said first component being carried away from said first component by said one or more jumpers, said one or more jumpers extending physically around a side edge of said PCB.

2. The arrangement of claim 1, further comprising:
    one or more thermally-conductive gap pads thermally coupling said first component to said one or more jumpers, respectively.

3. The arrangement of claim 1, wherein portions of said one or more jumpers, respectively, extending physically around said side edge of said PCB are substantially either semi-circular and square-U-shaped in cross-section.

4. The arrangement of claim 1, further comprising:
    one or more thermally-conductive gap pads thermally coupling said one or more jumpers, respectively, to said heat sink.

5. The arrangement of claim 1, wherein said one or more jumpers, are made of copper or carbon fiber.

6. The arrangement of claim 1, wherein said one or more jumpers are U-shaped in cross-section to permit said one or more jumpers to extend physically around said side edge of said PCB.

7. The arrangement of claim 1, wherein, for each of said one or more jumpers, portions that align in a stacked fashion with said first and second components are thicker in cross-section than a portion extending physically around said side edge of said PCB.

8. The arrangement of claim 1, wherein said first component is an integrated circuit device.

9. The arrangement of claim 1, further comprising:
    a second to-be-cooled component coupled to said first side of said PCB and thermally coupled to said heat sink.

10. The arrangement of claim 9, further comprising, for each at least one of said one or more jumpers, the following:
    a first thermally-conductive gap pad thermally coupling said first component to the at least one jumper; and
    a second thermally-conductive gap pad thermally couple said second component to the at least one jumper.

11. The arrangement of claim 10, wherein said first and second components are aligned so as to be opposite each other across said PCB.

12. The arrangement of claim 11, wherein:
    said first and second gap pads are formed of material having substantially the same thermal resistively; and
    a thickness of said first gap pad is greater than a thickness of said second gap pad so as to balance a first thermal resistance between said first component and said heat sink versus a second thermal resistance between said second component and said heat sink.

13. The apparatus of claim 1, wherein:
    said one or more jumpers have relatively stiff surfaces located at the thermal interfaces with said heat sink and said first component, respectively, to promote efficient thermal connections; and
    said one or more jumpers have a relatively flexible portion extending physically around said side edge of said PCB to promote ease of assembly of said arrangement.

14. The apparatus of claim 1, wherein one of the following applies:
    first ends of said one or more jumpers are interposed between said heat sink and said PCB,
    said heat sink is interposed between said first ends of said one or more jumpers and said PCB, and
    said first ends of said one or more jumpers are coupled to an end of said heat sink so as to be substantially perpendicular to a second end of said one or more jumpers.

15. An arrangement for cooling components on a printed circuit board, the arrangement comprising:

a printed circuit board ("PCB") having at least first and second to-be-cooled components coupled to said PCB, said first component being located on a first side of said PCB and said second component being located on a second side of said PCB, said second side being located on a second side of said PCB and second side being opposite to said first side;

a heat sink arranged on said first side of said PCB, said heat sink being thermally coupled to said first component; and a thermal jumper thermally coupling said second component on said second side to said heat sink on said first side, said jumper extending physically around a side edge of said PCB.

16. The arrangement of claim 15, further comprising:
a thermally-conductive gap pad thermally coupling said first component to said jumper.

17. The arrangement of claim 15, further comprising:
a thermally-conductive gap pad thermally coupling said second component to said jumper.

18. The arrangement of claim 15, further comprising:
a thermally-conductive gap pad thermally coupling said jumper to said heat sink.

19. The arrangement of claim 15, wherein said jumper is made of copper or carbon fiber.

20. The arrangement of claim 15, wherein said jumper is U-shaped in cross-section to permit said jumper to extend physically around said side edge of said PCB.

21. The arrangement of claim 15, wherein portions of said jumper that align in a stacked fashion with said first and second components are thicker in cross-section than a portion extending physically around said side edge of said PCB.

22. The arrangement of claim 15, wherein a portion of said jumper extending physically around said side edge of said PCB is substantially either semi-circular or square-U-shaped in cross-section.

23. The arrangement of claim 15, wherein said first and second components are integrated circuit devices.

24. The arrangement of claim 15, further comprising:
a first thermally-conductive gap pad thermally coupling said first component to said jumper; and a second thermally-conductive gap pad thermally coupling said second component to said jumper;

wherein said first and second gap pads are formed of material having substantially the same thermal resistivity; and wherein a thickness of said first gap pad is greater than a thickness of said second gap pad so as to balance a first thermal resistance between said first component and said heat sink versus a second thermal resistance between said second component and said heat sink.

25. The apparatus of claim 15, wherein:
said jumper has relatively stiff surfaces located at the thermal interfaces with said heat sink and said first and second components, respectively, to promote efficient thermal connections; and said jumper has a relatively flexible portion extending physically around said side edge of said PCB to promote ease of assembly of said arrangement.

26. The apparatus of claim 1, wherein a portion of said jumper extending physically around said side edge of said PCB is finned.

27. The arrangement of claim 15, wherein a portion of said jumper extending physically around said side edge of said PCB is finned.

28. The apparatus of claim 1, wherein at least a substantial portion of the first to-be-cooled component is arranged on said second side of said PCB.

* * * * *